US012039421B2

United States Patent
Miao et al.

(10) Patent No.: US 12,039,421 B2
(45) Date of Patent: Jul. 16, 2024

(54) DEEP LEARNING NUMERIC DATA AND SPARSE MATRIX COMPRESSION

(71) Applicant: Intel Corporation, Santa Clara, CA (US)

(72) Inventors: Yingyu Miao, Cupertino, CA (US); Ning Xue, San Jose, CA (US)

(73) Assignee: INTEL CORPORATION, Santa Clara, CA (US)

(*) Notice: Subject to any disclaimer, the term of this patent is extended or adjusted under 35 U.S.C. 154(b) by 671 days.

(21) Appl. No.: 17/122,384

(22) Filed: Dec. 15, 2020

(65) Prior Publication Data

US 2021/0174259 A1 Jun. 10, 2021

(51) Int. Cl.
*G06F 17/16* (2006.01)
*G06N 20/00* (2019.01)
*H03M 7/30* (2006.01)
*G06F 11/14* (2006.01)

(52) U.S. Cl.
CPC ............ *G06N 20/00* (2019.01); *G06F 17/16* (2013.01); *H03M 7/3088* (2013.01); *H03M 7/702* (2013.01); *G06F 11/14* (2013.01)

(58) Field of Classification Search
CPC ......... G06N 20/00; G06F 17/16; G06F 11/14; H03M 7/3088; H03M 7/702
See application file for complete search history.

(56) References Cited

U.S. PATENT DOCUMENTS

2020/0057697 A1* 2/2020 Yeung ................. G06F 11/1466

FOREIGN PATENT DOCUMENTS

CN 114638334 A 6/2022
JP 2022094926 A 6/2022

* cited by examiner

*Primary Examiner* — Joseph J Lauture
(74) *Attorney, Agent, or Firm* — JAFFERY WATSON MENDONSA & HAMILTON LLP

(57) ABSTRACT

An apparatus to facilitate deep learning numeric data and sparse matrix compression is disclosed. The apparatus includes a processor comprising a compression engine to: receive a data packet comprising a plurality of cycles of data samples, and for each cycle of the data samples: pass the data samples of the cycle to a compressor dictionary; identify, from the compressor dictionary, tags for each of the data samples, wherein the compressor dictionary comprises at least a first tag for data having a value of zero and a second tag for data having a value of one; and compress the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

20 Claims, 9 Drawing Sheets

| Tag Value 410 | Description 420 |
|---|---|
| 0x0 - 0x4 | Word is partially compressed, index to dictionary |
| 0x5 | Word is equal to one |
| 0x6 | Word is equal to zero |
| 0x7 | Word is uncompressed |

Store, as a group, tags identified for each data sample of a cycle of a data packet in a compressed cycle data, where the tags include at least a first tag indicating the data sample has a zero value or a second tag indicating the data sample has a one value
665

↓

Store, in the compressed cycle data subsequent to the group of the tags, a size byte indicating a size of the compressed cycle data
670

↓

Store, in the compressed cycle data subsequent to the size byte, partial values of the data samples having partial match tags in the group of the tags, the partial values including sign and exponent values of the data samples identified with the partial match tags
675

↓

Store, in the compressed data sample subsequent to the partial values, a complete portion of the data samples identified with a no match tag in the group of the tags, the complete portion including exponent and signficand values of the data samples identified with the no match tag
680

↓

Concatenate the compressed cycle data with other compressed cycle data of the data packet in a compressed data packet
685

↓

Add zero padding to an end of the compressed data packet subsequent to the compressed data samples
690

*FIG. 6B*

DEEP LEARNING NUMERIC DATA AND SPARSE MATRIX COMPRESSION

FIELD

This disclosure relates generally to machine learning and more particularly to deep learning numeric data and sparse matrix compression.

BACKGROUND OF THE DISCLOSURE

Unlike natural intelligence displayed by humans and animals, artificial intelligence (AI) is intelligence demonstrated by machines. As machines become increasingly capable, machine learning becomes possible. Machine learning is how an empowered machine perceives its surroundings and learns to alter its behavior without human being influences. The goal is to enable machines to learn by themselves using the provided data and make accurate predictions.

Deep learning is a subset of machine learning. It is the next evolution of machine learning. Deep learning algorithms are inspired by how information processed by the human being brain. Compared to machine learning, deep learning deals with large data sets, is more accurate, utilizes more computing and predicts better.

Deep learning applications require process and send/receive large amount of numeric data. To save routing bandwidth and storage capacity, data is compressed. Efficient implementation of compression/de-compression can improve performance of deep learning applications.

BRIEF DESCRIPTION OF THE DRAWINGS

So that the manner in which the above recited features of the present embodiments can be understood in detail, a more particular description of the embodiments, briefly summarized above, may be had by reference to embodiments, some of which are illustrated in the appended drawings. It is to be noted, however, that the appended drawings illustrate typical embodiments and are therefore not to be considered limiting of its scope. The figures are not to scale. In general, the same reference numbers will be used throughout the drawing(s) and accompanying written description to refer to the same or like parts.

FIG. 4 depicts an example compressor dictionary for deep learning numeric data and sparse matrix compression, according to implementations of the disclosure.

FIG. 6B is a flow diagram illustrating another embodiment of a method for deep learning numeric data and sparse matrix compression.

DETAILED DESCRIPTION

Figure 1:
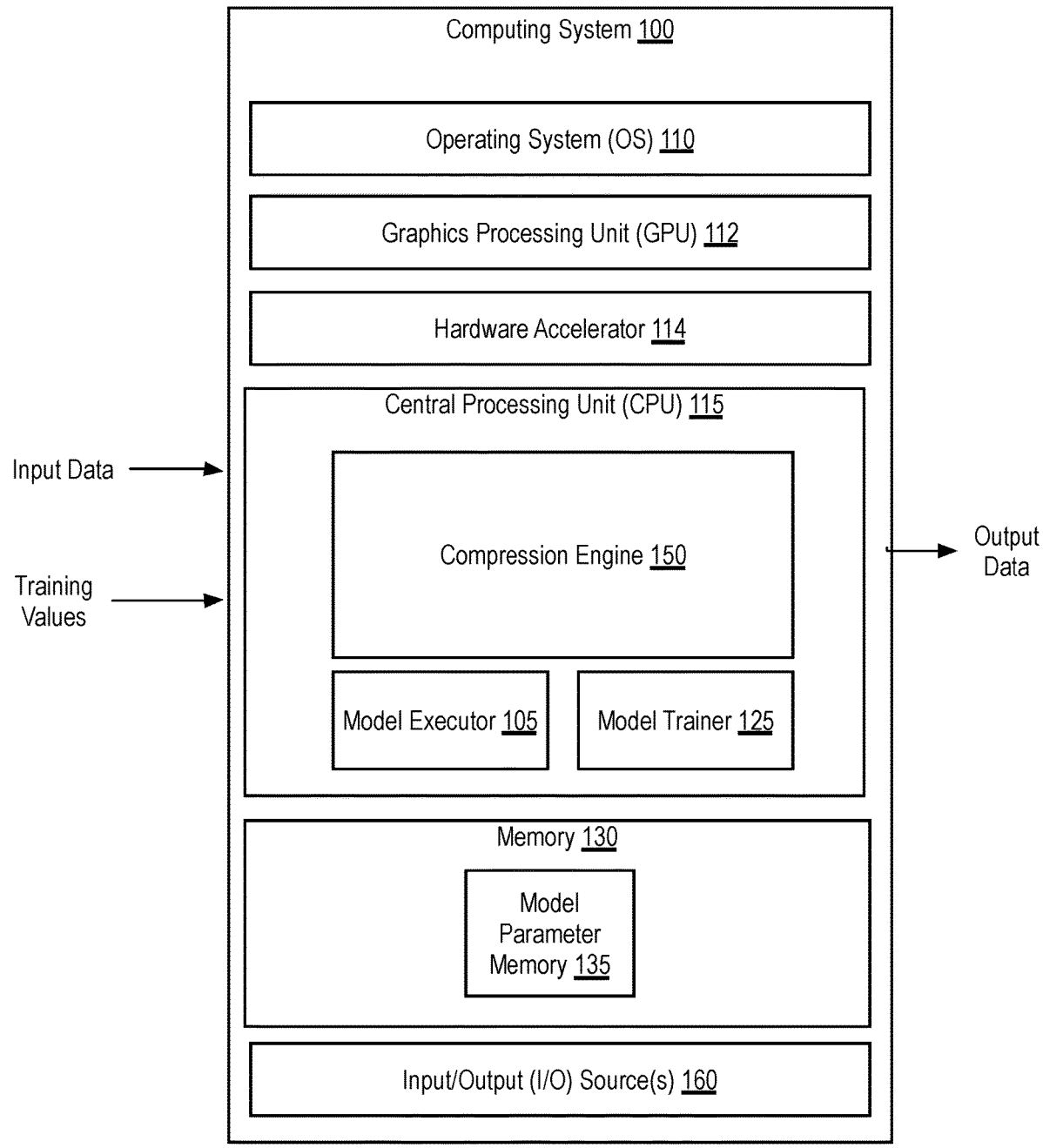
FIG. 1 is a block diagram of an example computing system that may be used to implement deep learning numeric data and sparse matrix compression, according to implementations of the disclosure.

Implementations of the disclosure describe deep learning numeric data and sparse matrix compression. In computer engineering, computing architecture is a set of rules and methods that describe the functionality, organization, and implementation of computer systems. Today's computing systems are expected to deliver near zero-wait responsiveness and superb performance while taking on large workloads for execution. Therefore, computing architectures have continually changed (e.g., improved) to accommodate demanding workloads and increased performance expectations.

Examples of large workloads include neural networks, artificial intelligence (AI), machine learning, etc. Such workloads have become more prevalent as they have been implemented in a number of computing devices, such as personal computing devices, business-related computing devices, etc. Furthermore, with the growing use of large machine learning and neural network workloads, new silicon has been produced that is targeted at running large workloads. Such new silicon includes dedicated hardware accelerators (e.g., graphics processing unit (GPU), field-programmable gate array (FPGA), vision processing unit (VPU), etc.) customized for running large neural networks using data parallelism or model parallelism.

Artificial intelligence (AI), including machine learning (ML), deep learning (DL), and/or other artificial machine-driven logic, enables machines (e.g., computers, logic circuits, etc.) to use a model to process input data to generate an output based on patterns and/or associations previously learned by the model using a training process. For instance, the model may be trained with data to recognize patterns and/or associations and follow such patterns and/or associations when processing input data such that other input(s) result in output(s) consistent with the recognized patterns and/or associations.

Many different types of machine learning models and/or machine learning architectures exist. In some examples disclosed herein, a convolutional neural network is used. Using a convolutional neural network enables classification of objects in images, natural language processing, etc. In general, machine learning models/architectures that are suitable to use in the example approaches disclosed herein may include convolutional neural networks. However, other types of machine learning models could additionally or alternatively be used such as recurrent neural network, feedforward neural network, etc.

In general, implementing a ML/AI system involves two phases, a learning/training phase and an inference phase. In the learning/training phase, a training algorithm is used to train a model to operate in accordance with patterns and/or associations based on, for example, training data. In general, the model includes internal parameters that guide how input data is transformed into output data, such as through a series of nodes and connections within the model to transform input data into output data. Additionally, hyperparameters are used as part of the training process to control how the learning is performed (e.g., a learning rate, a number of layers to be used in the machine learning model, etc.). Hyperparameters are defined to be training parameters that are determined prior to initiating the training process.

Different types of training may be performed based on the type of ML/AI model and/or the expected output. For example, supervised training uses inputs and corresponding expected (e.g., labeled) outputs to select parameters (e.g., by iterating over combinations of select parameters) for the ML/AI model that reduce model error. As used herein, labelling refers to an expected output of the machine learning model (e.g., a classification, an expected output value, etc.) Alternatively, unsupervised training (e.g., used in deep learning, a subset of machine learning, etc.) involves inferring patterns from inputs to select parameters for the ML/AI model (e.g., without the benefit of expected (e.g., labeled) outputs).

As previously noted, ML/AI is how an empowered machine perceives its surroundings and learns to alter its behavior without human being influences. ML/AI aims to enable machines to learn by themselves using the provided data and make accurate predictions. DL algorithms are focused on how information is processed by the human being brain. Compared to ML, DL deals with large data sets, is more accurate, utilizes more computing and predicts better.

DL applications process and send/receive large amounts of numeric data. To save routing bandwidth and storage capacity, data is compressed. Efficient implementation of compression/de-compression is utilized to improve performance of DL applications. Hardware compression/de-compression techniques used in ML and DL workloads strive to achieve efficient hardware implementation of such techniques. A concern to achieving improved performance in ML/DL applications is in the field of memory bandwidth consumption. Compression addresses this concern to enable silicon solutions for rapidly growing neural networks.

Compression can involve heavy data searching and computing. As such, implementations of compression techniques often introduce both data routing latency and timing challenges in deep submicron silicon. Deep submicron silicon can refer to high-density integration of transistors in integrated circuit (IC) designs. In some implementations, deep submicron technology can refer to ICs fabricated using 0.18 um, 0.13 um, or 7 nm process technology, for example.

The data routing delays introduced using compression techniques can degrade system performance. Compressing wide data (e.g., 512 bit) is restricted by timing closure in deep submicron silicon. Conventional compression approaches do not compress data within a single clock cycle. Instead, in the conventional approaches, each cycle of data takes two cycles to be compressed. As a result, in order to keep up the data throughput, two compression engines are used in the conventional approaches. Each compression engine handles every other packet. Compressed data from both compression engines are then merged back into one data stream. As data packet sizes vary and duration of compressing a fixed data size is data dependent, distributing every other packet between two compression engines does not evenly distribute compression bandwidth. Over time, the slower compression engine may cause the other compression engine to stay idle. Hence, the conventional compression technique of using two compression engines does not meet data throughput demands. Furthermore, managing packet distribution and merging the compression results introduce additional circuitry such as FIFOs and a large amount of logics, as well as introduce data latency. In addition to area and power cost, data splitting and merging functions add data latency and power consumption costs as well in the conventional compression techniques.

In ML/DL learning applications, the output of activation functions is typically sparse (e.g., includes a majority of 0 values) and is suited for compression, while other data may be close to random. As such, overall compression gains depend upon how well the sparse data is compressed. The conventional compression techniques utilizes a few hundred bits and, as such, are not optimal.

Timing closure of the conventional compression techniques at, for example, a 7 nm process technology is another challenge and is shown to meet approximately 50% of a speed target. This degradation makes routing a system performance bottleneck as, on average, computing elements spend half time either waiting for input data to arrive or waiting for produced data to be taken.

Furthermore, the conventional compression techniques utilize a compression ratio that is not optimized in typical DL applications. In DL applications, activation functions produce many 0s and is in feature map data. In addition, quantization also introduces more 0s and is in weight values. These are the best case as the size could be compressed dramatically. In the conventional compression techniques, a value of 0 is specially treated but a value of 1 does not receive any special treatment. When a value such as 1 does not receive specialized compression treatment in this case, its compressed size reduction is limited to half of its original data size. The compression data size is at least half of its original data size. Even when the input data 0s are specially treated, the minimum size of compression ratio is 81% (i.e., 19% of its original data size, which is not optimal.)

In addition, the conventional compression techniques are packet based. For example, the first 512-bit in each data packet is encoded with a silicon hardcoded set of hash values that is not customizable per application. The chance of hitting this set of silicon hardcoded hash values is minimal in real applications. As such, the first 512-bit data in each packet is rarely compressed when utilizing the conventional compression techniques.

Implementations of the disclosure address the above-described drawbacks by providing a single compression engine that matches full data throughput, with optimized compression gains while timing demands. In one implementation, a compression engine can implement deep learning numeric data and sparse matrix compression by receiving a data packet that includes a plurality of cycles of data samples. For each cycle of the data samples, the compression engine can pass the data samples of the cycle to a compressor dictionary. The compression engine utilizes the compressor dictionary to identify tags for each of the data samples in the cycle. In one implementation, the compressor dictionary includes at least a first tag for data having a value of zero and a second tag for data having a value of one. The compression engine can then compress the data samples into compressed cycle data by storing the tags as compressed data.

In one implementation, the data samples identified with the first tag or the second tag are compressed using the first tag or second tag, while excluding values of the data samples identified with the first tag or the second tag from the compressed cycle data. The compressor dictionary further includes tags indicating a partial match to values in the compressor dictionary, and a tag indicating no match. The tag values are stored in the compressed data cycle, followed by a portion (e.g., sign and exponent values) of the data samples having partial matches, and then followed by a whole portion of the data samples having no match. The compressed data cycles of a data packet are then concatenated together in the data packet and the data packet is zero padded at the end of the compressed data cycles.

Implementations of the disclosure provide a compression technique for ML and DL activation functions, such as Rectified Linear Unit (ReLU), Sigmoid and Tanh. The implementations of the disclosure simplify data management, provide lower latency, and provide higher compression gains. Furthermore, implementations may be put into place with fewer gates and lower power. Conventional compression schemes implemented for DL or AI focus on either weights or activations compression. Implementations of the disclosure provide a solution that applies to all the data of a ML or DL workload, including weights and activations. Implementations of the disclosure provide an overall better compression rate as both weights and activation data can be compressed.

In addition, conventional compression techniques utilize run length encoding of non-0 values, where the non-0 values and their locations are encoded. In contrast, implementations of the disclosure focus on large chunk of 0s and utilize spare bits in packet header fields, resulting in a smaller compressed packet size. Furthermore, decompressing of large chunk of 0s is less time consuming than decoding run lengths. As a result, implementations of the disclosure benefit silicon timing in implementation.

In conclusion, implementations of the disclosure offer an innovative compression algorithm with optimized feasible implementation for ML and DL applications with improved compression gains for sparse or non-sparse data packets. Implementation provide for less gate count and lower power utilization. Implementations are also validated with lower latency and meet various timing demands (e.g., operate beyond 2.05 Ghz in 7 nm process node).

FIG. 1 is a block diagram of an example computing system that may be used to implement deep learning numeric data and sparse matrix compression, according to implementations of the disclosure. The example computing system 100 may be implemented as a component of another system such as, for example, a mobile device, a wearable device, a laptop computer, a tablet, a desktop computer, a server, etc. In one embodiment, computing system 100 includes or can be integrated within (without limitation): a server-based gaming platform; a game console, including a game and media console; a mobile gaming console, a handheld game console, or an online game console. In some embodiments the computing system 100 is part of a mobile phone, smart phone, tablet computing device or mobile Internet-connected device such as a laptop with low internal storage capacity.

In some embodiments the computing system 100 is part of an Internet-of-Things (IoT) device, which are typically resource-constrained devices. IoT devices may include embedded systems, wireless sensor networks, control systems, automation (including home and building automation), and other devices and appliances (such as lighting fixtures, thermostats, home security systems and cameras, and other home appliances) that support one or more common ecosystems, and can be controlled using devices associated with that ecosystem, such as smartphones and smart speakers.

Computing system 100 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. In some embodiments, the computing system 100 includes or is part of a television or set top box device. In one embodiment, computing system 100 can include, couple with, or be integrated within a self-driving vehicle such as a bus, tractor trailer, car, motor or electric power cycle, plane or glider (or any combination thereof). The self-driving vehicle may use computing system 100 to process the environment sensed around the vehicle.

As illustrated, in one embodiment, computing system 100 may include any number and type of hardware and/or software components, such as (without limitation) graphics processing unit ("GPU", general purpose GPU (GPGPU), or simply "graphics processor") 112, a hardware accelerator 114, central processing unit ("CPU" or simply "application processor") 115, memory 130, network devices, drivers, or the like, as well as input/output (I/O) sources 160, such as touchscreens, touch panels, touch pads, virtual or regular keyboards, virtual or regular mice, ports, connectors, etc. Computing system 100 may include operating system (OS) 110 serving as an interface between hardware and/or physical resources of the computing system 100 and a user. In some implementations, the computing system 100 may include a combination of one or more of the CPU 115, GPU 112, and/or hardware accelerator 114 on a single system on a chip (SoC), or may be without a GPU 112 or visual output (e.g., hardware accelerator 114) in some cases, etc.

As used herein, "hardware accelerator", such as hardware accelerator 114, refers to a hardware device structured to provide for efficient processing. In particular, a hardware accelerator may be utilized to provide for offloading of some processing tasks from a central processing unit (CPU) or other general processor, wherein the hardware accelerator may be intended to provide more efficient processing of the processing tasks than software run on the CPU or other processor. A hardware accelerator may include, but is not limited to, a graphics processing unit (GPU), a vision processing unit (VPU), neural processing unit, AI (Artificial Intelligence) processor, field programmable gate array (FPGA), or application-specific integrated circuit (ASIC).

The GPU 112 (or graphics processor 112), hardware accelerator 114, and/or CPU 115 (or application processor 115) of example computing system 100 may include a model trainer 125 and model executor 105. Although the model trainer 125 and model executor 105 are depicted as part of the CPU 115, in some implementations, the GPU 112 and/or hardware accelerator 114 may include the model trainer 125 and model executor 105.

The example model executor 105 accesses input values (e.g., via an input interface (not shown)), and processes those input values based on a machine learning model stored in a model parameter memory 135 of the memory 130 to produce output values (e.g., via an output interface (not shown)). The input data may be received from one or more data sources (e.g., via one or more sensors, via a network interface, etc.). However, the input data may be received in any fashion such as, for example, from an external device (e.g., via a wired and/or wireless communication channel). In some examples, multiple different types of inputs may be received. In some examples, the input data and/or output data is received via inputs and/or outputs of the system of which the computing system 100 is a component.

In the illustrated example of FIG. 1, the example neural network parameters stored in the model parameter memory 135 are trained by the model trainer 125 such that input training data (e.g., received via a training value interface (not shown)) results in output values based on the training data.

In the illustrated example of FIG. 1, the model trainer 125 and/or model executor 105 utilizes a compression engine 150 when processing the model during training and/or inference. The example model executor 105, the example model trainer 125, and the example compression engine 150 are implemented by one or more logic circuits such as, for example, hardware processors. In some examples, one or more of the example model executor 105, the example model trainer 125, and the example compression engine 150 may be implemented by a same hardware component (e.g., a same logic circuit) or by different hardware components (e.g., different logic circuits, different computing systems, etc.). However, any other type of circuitry may additionally or alternatively be used such as, for example, one or more analog or digital circuit(s), logic circuits, programmable processor(s), application specific integrated circuit(s) (ASIC(s)), programmable logic device(s) (PLD(s)), field programmable logic device(s) (FPLD(s)), digital signal processor(s) (DSP(s)), etc.

In examples disclosed herein, the example model executor 105 executes a machine learning model. The example machine learning model may be implemented using a neural network (e.g., a feedforward neural network). However, any other past, present, and/or future machine learning topology(ies) and/or architecture(s) may additionally or alternatively be used such as, for example, a CNN.

To execute a model, the example model executor 105 accesses input data. The example model executor 105 applies the model (defined by the model parameters (e.g., neural network parameters including weight and/or activations) stored in the model parameter memory 135) to the input data.

The example model parameter memory 135 of the illustrated example of FIG. 1 is implemented by any memory, storage device and/or storage disc for storing data such as, for example, flash memory, magnetic media, optical media, etc. Furthermore, the data stored in the example model parameter memory 135 may be in any data format such as, for example, binary data, comma delimited data, tab delimited data, structured query language (SQL) structures, etc. While in the illustrated example the model parameter memory 135 is illustrated as a single element, the model parameter memory 135 and/or any other data storage elements described herein may be implemented by any number and/or type(s) of memories. In the illustrated example of FIG. 1, the example model parameter memory 135 stores model weighting parameters that are used by the model executor 105 to process inputs for generation of one or more outputs as output data.

In examples disclosed herein, the output data may be information that classifies the received input data (e.g., as determined by the model executor 105.). However, any other type of output that may be used for any other purpose may additionally or alternatively be used. In examples disclosed herein, the output data may be output by an input/output (I/O) source 160 that displays the output values. However, in some examples, the output data may be provided as output values to another system (e.g., another circuit, an external system, a program executed by the computing system 100, etc.). In some examples, the output data may be stored in a memory.

The example model trainer 125 of the illustrated example of FIG. 1 compares expected outputs (e.g., received as training values at the computing system 100) to outputs produced by the example model executor 105 to determine an amount of training error, and updates the model parameters (e.g., model parameter memory 135) based on the amount of error. After a training iteration, the amount of error is evaluated by the model trainer 125 to determine whether to continue training. In examples disclosed herein, errors are identified when the input data does not result in an expected output. That is, error is represented as a number of incorrect outputs given inputs with expected outputs. However, any other approach to representing error may additionally or alternatively be used such as, for example, a percentage of input data points that resulted in an error.

The example model trainer 125 determines whether the training error is less than a training error threshold. If the training error is less than the training error threshold, then the model has been trained such that it results in a sufficiently low amount of error, and no further training is pursued. In examples disclosed herein, the training error threshold is ten errors. However, any other threshold may additionally or alternatively be used. Moreover, other types of factors may be considered when determining whether model training is complete. For example, an amount of training iterations performed and/or an amount of time elapsed during the training process may be considered.

The training data that is utilized by the model trainer 125 includes example inputs (corresponding to the input data expected to be received), as well as expected output data. In examples disclosed herein, the example training data is provided to the model trainer 125 to enable the model trainer 125 to determine an amount of training error.

In examples disclosed herein, the example model trainer 125 and the example model executor 105 utilize the compression engine 150 to implement deep learning numeric data and sparse matrix compression. In one implementation, the compression engine 150 implements deep learning numeric data and sparse matrix compression for the model executor 105 and/or the model trainer 125 by receiving a data packet that includes a plurality of cycles of data samples. For each cycle of the data samples, the compression engine 150 can pass the data samples of the cycle to a compressor dictionary. The compression engine 150 utilizes the compressor dictionary to identify tags for each of the data samples in the cycle. In one implementation, the compressor dictionary includes at least a first tag for data having a value of zero and a second tag for data having a value of one. The compression engine 150 can then compress the data samples into compressed cycle data by storing the tags as compressed data. In one implementation, the data samples identified with the first tag or the second tag are compressed using the first tag or second tag, while excluding values of the data samples identified with the first tag or the second tag from the compressed cycle data.

Further discussion and detailed description of the implementation of the example compression engine 150 by the model trainer 125 and/or the model executor 105 are provided below with respect to FIGS. 2-6.

The example I/O source 160 of the illustrated example of FIG. 1 enables communication of the model stored in the model parameter memory 135 with other computing systems. In some implementations, the I/O source(s) 160 may include, at but is not limited to, a network device, a microprocessor, a camera, a robotic eye, a speaker, a sensor, a display screen, a media player, a mouse, a touch-sensitive device, and so on. In this manner, a central computing system (e.g., a server computer system) can perform training of the model and distribute the model to edge devices for utilization (e.g., for performing inference operations using the model). In examples disclosed herein, the I/O source 160 is implemented using an Ethernet network communicator. However, any other past, present, and/or future type(s) of communication technologies may additionally or alternatively be used to communicate a model to a separate computing system.

While an example manner of implementing the computing system 100 is illustrated in FIG. 1, one or more of the elements, processes and/or devices illustrated in FIG. 1 may be combined, divided, re-arranged, omitted, eliminated and/or implemented in any other way. Further, the example model executor 105, the example model trainer 125, the example compression engine 150, the I/O source(s) 160, and/or, more generally, the example computing system 100 of FIG. 1 may be implemented by hardware, software, firmware and/or any combination of hardware, software and/or firmware. Thus, for example, any of the example model executor 105, the example model trainer 125, the example compression engine 150, the example I/O source(s) 160, and/or, more generally, the example computing system 100 of FIG. 1 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

In some implementations of the disclosure, a software and/or firmware implementation of at least one of the example model executor 105, the example model trainer 125, the example compression engine 150, the example I/O source(s) 160, and/or, more generally, the example computing system 100 of FIG. 1 be provided. Such implementations can include a non-transitory computer readable storage device or storage disk such as a memory, a digital versatile disk (DVD), a compact disk (CD), a Blu-ray disk, etc. including the software and/or firmware. Further still, the example computing system 100 of FIG. 1 may include one or more elements, processes and/or devices in addition to, or instead of, those illustrated in FIG. 1, and/or may include more than one of any or all of the illustrated elements, processes, and devices. As used herein, the phrase "in communication," including variations thereof, encompasses direct communication and/or indirect communication through one or more intermediary components, and does not utilize direct physical (e.g., wired) communication and/or constant communication, but rather additionally includes selective communication at periodic intervals, scheduled intervals, aperiodic intervals, and/or one-time events.

Figure 2:
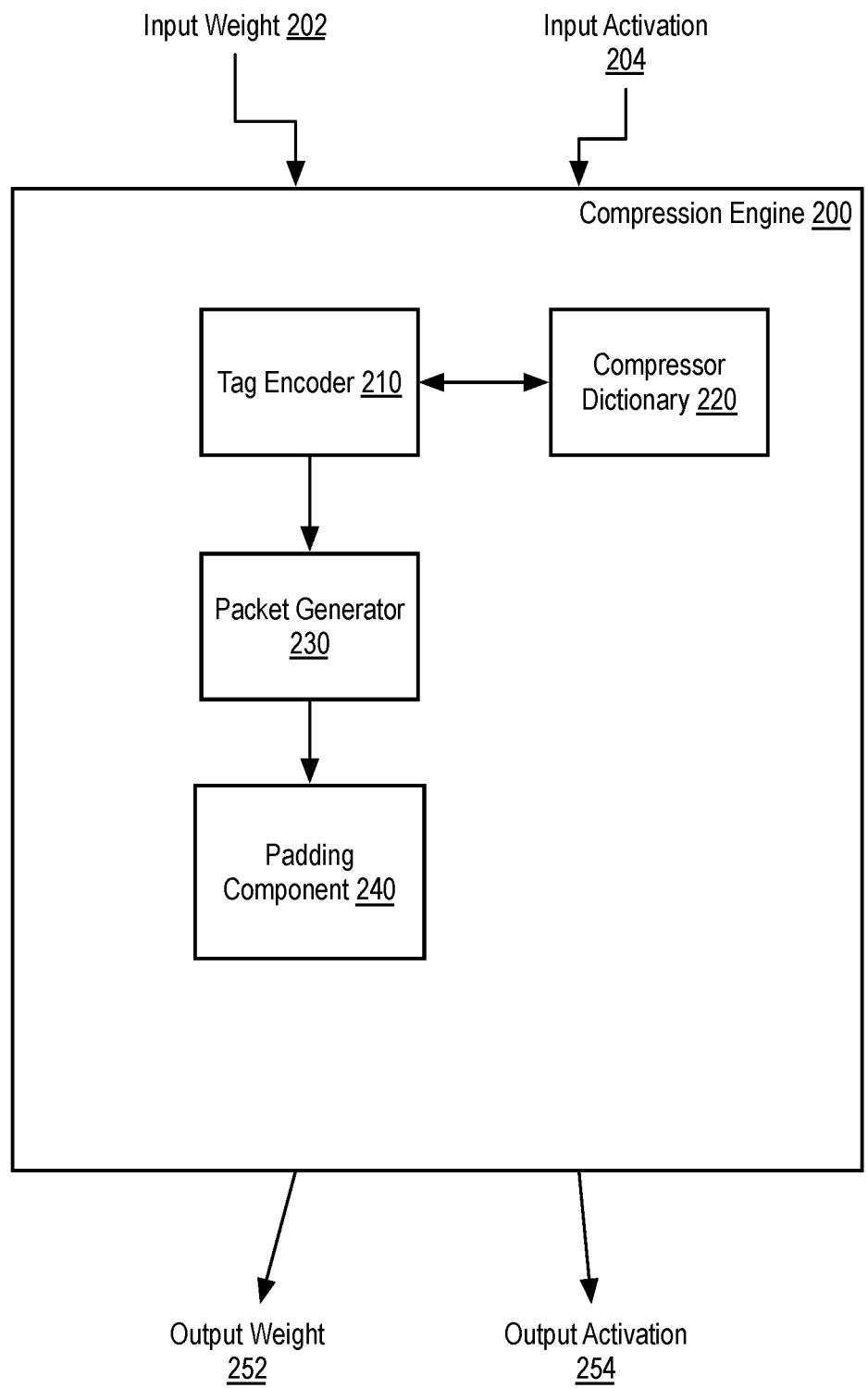
FIG. 2 depicts an example compression engine to implement deep learning numeric data and sparse matrix compression, according to implementations of the disclosure.

FIG. 2 depicts an example compression engine 200 to implement deep learning numeric data and sparse matrix compression, according to implementations of the disclosure. In one implementation, the compression engine 200 is the same as compression engine 150 described with respect to FIG. 1. Compression engine 200 is further illustrated to include a tag encoder 210, compressor dictionary 220, packet generator 230, and/or padding component 240. The example compression engine 200 of FIG. 2 may include one or more elements, processes and/or devices in addition to, or instead of, those illustrated in FIG. 2, and/or may include more than one of any or all of the illustrated elements, processes, and devices. In some examples, one or more of the example tag encoder 210, the example compressor dictionary 220, the example packet generator 230, and/or the example padding component 240 may be implemented by a same hardware component (e.g., a same logic circuit) or by different hardware components (e.g., different logic circuits, different computing systems, etc.). However, any other type of circuitry may additionally or alternatively be used such as, for example, one or more analog or digital circuit(s), logic circuits, programmable processor(s), application specific integrated circuit(s) (A SIC(s)), programmable logic device(s) (PLD(s)), field programmable logic device(s) (FPLD(s)), digital signal processor(s) (DSP(s)), etc.

In one implementation, the compression engine 200 may receive input data. In one example, the input values may be input weight values 202 and/or input activation values 204 of an ML model. The compression engine 200 may compress the input weights 202 and/or input activations 204 as part of a training process and/or an inference process associated with the ML model. In some implementations, the compression engine 200 may perform decompression of input weights 202 and/or input activations 204 in a reverse process to the compression process described herein. For ease of discussion, the following description discusses a compression process. However, implementations of the disclosure similarly encompass an analogous decompression process to the described compression process herein.

In one implementation, the input weight 202 and/or input activation 204 may arrive in the form of an uncompressed data packet having a plurality of data samples. These data samples may include the input weights or input activations, for example. In one implementation, the data packet may include a plurality of cycles of data samples (e.g., 32 cycles of 32 data samples in a 512-bit data packet).

Figure 3A:
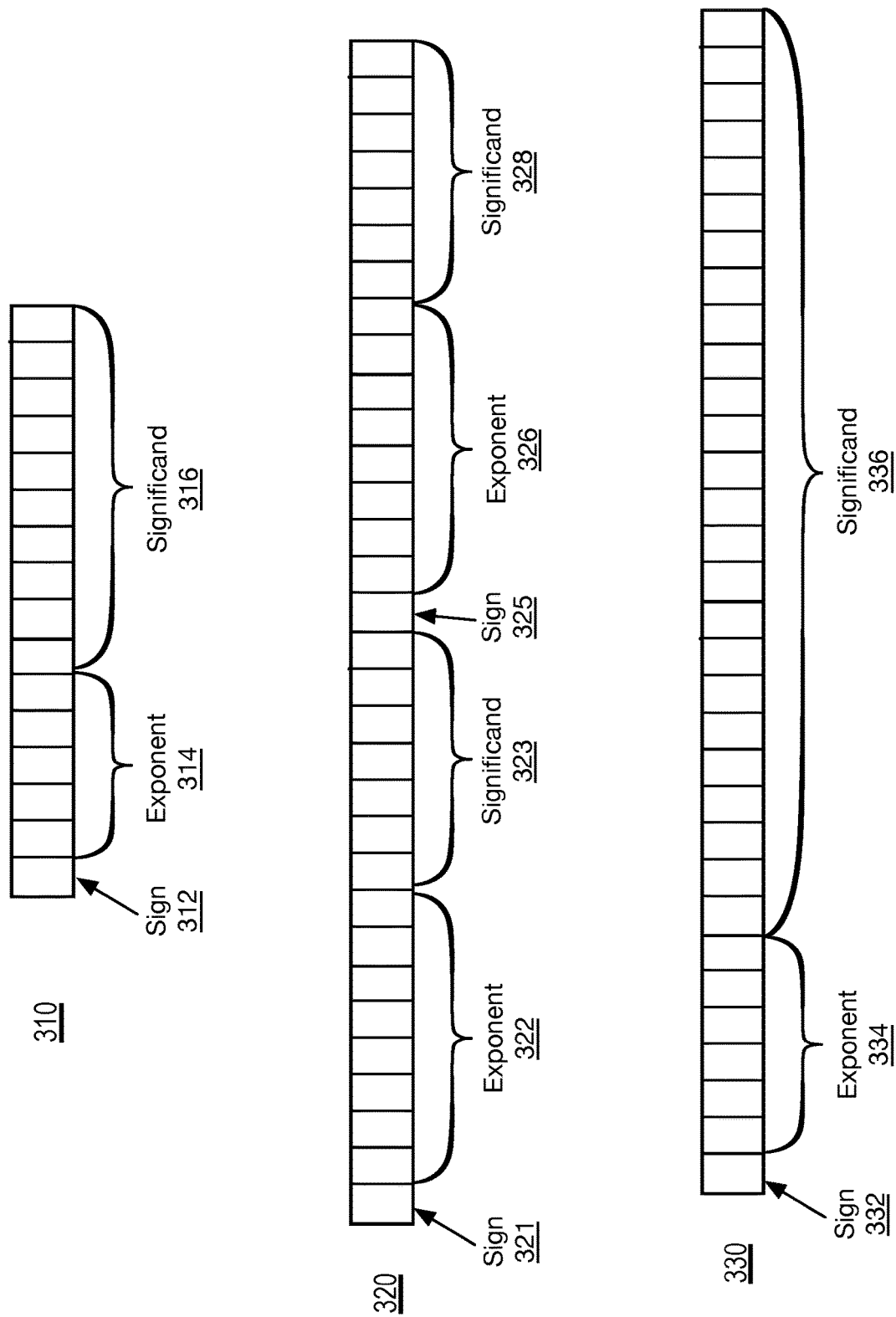
FIG. 3A depicts an example data sample formats, according to implementations of the disclosure.

FIG. 3A depicts example data sample formats 310, 320, 330 that may be processed by a compression engine according to implementations of the disclosure. In one implementation, the example data sample formats 310, 320, 330 may represent data samples that can be processed by compression engine 200 described with respect to FIG. 2. A compression engine, such as compression engine 200, may process any of a variety of data types including, but not limited to, floating point 16, floating point 32, single precision 8, single precision 16, single precision 32, and so on. Other data types than those listed herein may be processed by implementations of the disclosure.

Data sample 310 depicts an example half-precision floating point 16 (fp16) data type. As illustrated, the half-precision fp16 data sample 310 includes a 1-bit sign 312, an exponent 314 of width 5 bits, and a significand 316 of precision 11 bits (10 explicitly stored). The exponent may also be referred to as a literal, herein. The significand may also be referred to as a mantissa, herein. With respect to the half-precision fp16 data type, the exponent has a bias of 15, and regular numbers can be defined as $(-1)^{sign\ bit} \times 2^{exponent-15} \times 1.significantbits_2$.

Data sample 320 depicts an example bfloat 16 (bf16) data type. As illustrated, the bf16 data sample 320 is depicted as including 2 16-bit portions. Each 16-bit portion of the bf16 data sample 320 includes a 1-bit sign 321, 325, an exponent 322, 326 of width 8 bits, and a significand 323, 328 of precision 7 bits. As illustrated by data samples 310, 320, the bf16 data sample 320 has more exponent bits and fewer significand bits than the fp16 data sample 310.

Data sample 330 depicts an example floating point 32 (fp32) data type. As illustrated, the fp32 data sample 330 includes 1-bit sign 332, an exponent 334 of width 8 bits, and a significand 336 of precision 23 bits.

Figure 3B:
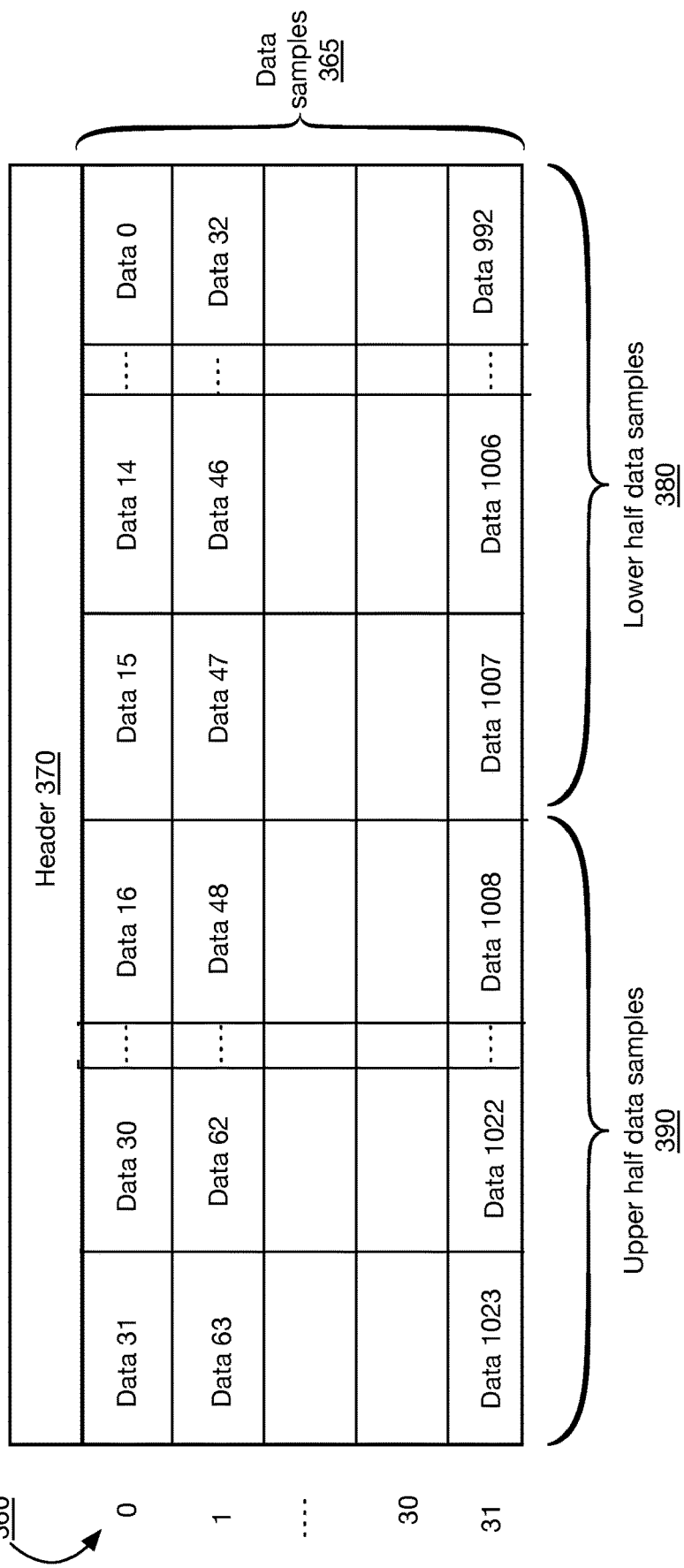
FIG. 3B depicts an example data packet to be compressed, according to implementations of the disclosure.

FIG. 3B depicts an example data packet 350 to be compressed, according to implementations of the disclosure.

In one implementation, the example data packet 350 may represent a data packet that can be processed by compression engine 200 described with respect to FIG. 2. The example data packet 350 is shown in an uncompressed form. As shown, in one example, data packet 350 includes 1 cycle 360 of header 370 and 32 cycles 360 of data samples 365. Other formats of data packet 350 may also be utilized and processed by a compression engine in implementations of the disclosure and are not limited to the example depiction of FIG. 3B describe herein.

In the example data packet 350 of FIG. 3B, each cycle 360 of data packet 350 has 32 BF16 data samples, shown as "data 0" through "data 1023". Each BF16 data sample 365 has 16 bits. In one example, each data sample 365 may be the same as data sample 320 described with respect to FIG. 3A. As such, the cycles 360 of data in data packet 350 have a total of 32×16=512 bits.

Referring back to FIG. 2, in one implementation, the tag encoder 210 may parse the data packet, such as data packet 350 of FIG. 3B, to obtain the individual data samples. The data samples in a data packet is compressed cycle by cycle. The tag encoder 210 may pass a cycle of data samples to the compressor dictionary 220. Each data sample of the data packet is compressed using the compressor dictionary 220. In one implementation, the compressor dictionary 220 may be a look up table or a hash table. In one implementation, the compressor dictionary 220 has 16 entries. However, other sizes of compressor dictionary 220 can be implemented and the disclosure is not limited to a 16-entry compressor dictionary 220. In one implementation, compressor dictionary 220 is sub-divided into multiple compressor sub-dictionaries. For example, compressor dictionary 220 may be divided into 2 compressor dictionaries (e.g., 2 hash tables) of 8 entries each.

FIG. 4 depicts an example compressor dictionary 400 for deep learning numeric data and sparse matrix compression, according to implementations of the disclosure. In one implementation, compressor dictionary 400 is the same as compressor dictionary 220 described with respect to FIG. 2. Compressor dictionary 400 may depict one of the compressor sub-dictionaries described above. As such, in one implementation, 2 copies (or, in some implementations, more than 2 copies) of compressor dictionary 400 may constitute compressor dictionary 220 described with respect to FIG. 2.

In implementations of the disclosure, the lower half data samples (e.g., lower half data samples 380 of FIG. 3B) of each cycle's data are processed by one compressor sub-dictionary 400, while the upper half data samples (e.g., upper half data samples 390 of FIG. 3B) of each cycle's data are processed by the other compressor sub-dictionary 400. The lower half data samples 380 and upper half data samples 390 are compressed independently and in parallel by the compression engine 200. The compressor dictionary 400 is used by the tag encoder 210 to examine each 256-bit chunk of data (e.g., the lower half data samples 380 or the upper half data samples 390) to check for the following cases: (1) a value 0 or 1; (2) a partial match of a data sample: matched mantissa value in the dictionary while its remaining sign bit and literal value differs; or (3) no match. As shown in FIG. 4, compressor dictionary 400 includes a tag value 410 that corresponds to a description 420 of each of the above cases.

For example, a data sample with a word value equal to 1 receives a tag value 410 of 0x5, a data sample with a word value equal to 0 receives a tag value 410 of 0x6, a data sample without a match to any of the descriptions 420 in the compressor dictionary 400 receives a tag value 410 of 0x7. Data samples partially matching any of a set of descriptions 420 in the compressor dictionary 400 receive the corresponding tag value 410 between 0x0 to 0x4, depending on the partial match. In one implementation, a partial match refers to a match of the significand (mantissa) value of the data sample to one of the descriptions 420 in the compressor dictionary 400.

The tag encoder 210 utilizes the compressor dictionary 220 to determine a tag value 410 corresponding to each data sample in the cycle and provides the determined tag value 410 to the packet generator 230. The packet generator 230 compresses the data samples of a cycle by giving all data samples that have value 0s or is the special tag values 410 in packet's header and storing no further information for those data samples (e.g., the actual values of the data samples are excluded from the compressed cycle data). For data samples having non-0 or non-1 data values, but whose mantissa value is matched (i.e., a partial match) is given the corresponding tag value 410 stored in the compressor dictionary 400, and the sign and exponent (literal) value of those data samples are stored. Data samples that do not have a matched value are given the tag value 410 that indicates no match, and a whole portion of those data samples is stored. The whole portion of the data sample refers to storing both of the significant (mantissa) and exponent (literal) values for the non-matched data samples.

In implementations of the disclosure, the packet generator 230 compresses the data samples of each cycle of a data packet into compressed cycle data. The packet generator 230 may combine the tag value 410 information identified for the data samples of the upper and lower halves of the cycle (e.g., from each of the sub-dictionaries of the compressor dictionary 220) into a single compressed cycle data for each cycle of the data packet.

Figure 5A:
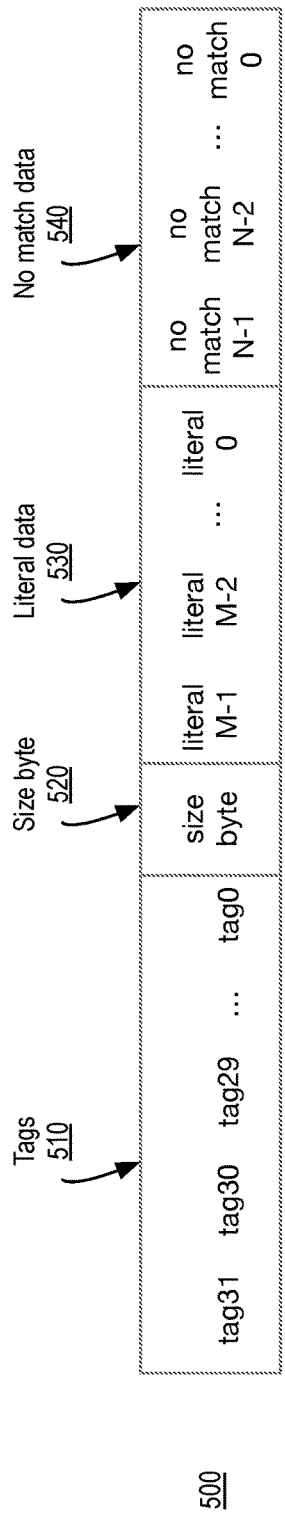
FIG. 5A depicts an example data sample of a data packet compressed using deep learning numeric data and sparse matrix compression, according to implementations of the disclosure.

FIG. 5A depicts example compressed cycle data 500 for a data packet based on deep learning numeric data and sparse matrix compression, according to implementations of the disclosure. In one implementation, compressed cycle data may be a compressed version of a cycle 360 of data samples 365 of data packet 350 described with respect for FIG. 3B. In one implementation, packet generator 230 of compression engine 200 described with respect to FIG. 2 may generate compressed cycle data 500 using deep learning numeric data and sparse matrix compression, according to implementations of the disclosure.

In implementations of the disclosure, to maintain byte alignment, the packet generator 230 first groups all of the identified tags for the data samples of a cycle together in a tag portion 510 of the compressed cycle data. The tag portion 510 may be followed by a size byte 520 that indicates a size of the compressed cycle data 560-585. In one implementation, the size byte 520 is added to point to the end of current compressed cycle data in the compressed data packet 550. In one implementation, the size byte 520 may be utilized by a decompressor to allocate the next compressed cycle data immediately.

The size byte 520 may be followed by literal data 530. The literal data 530 can include stored information of the partial matched data samples of the cycle. The stored information of the partial matched data samples can include the exponent values of the partial matched data samples. In this case, the significands of these data samples have been matched to the compressor dictionary 220 as indicated by their associated tag values and, thus, are not stored in the compressed cycle data 500 in order to provide compression savings.

Lastly, the literal data 530 may be followed by no match data 540. The no match data can include the stored information of no match data samples of the cycle. The stored information of the no march data samples can include the exponent and significand values of the no match data samples.

The packet generator 230 can concatenate the compressed cycle data 500 generated for each cycle of the data packet together into a compressed data packet. In one implementation, the compressed data packet is output by the compression engine as output weight 252 or output activation 254.

Figure 5B:
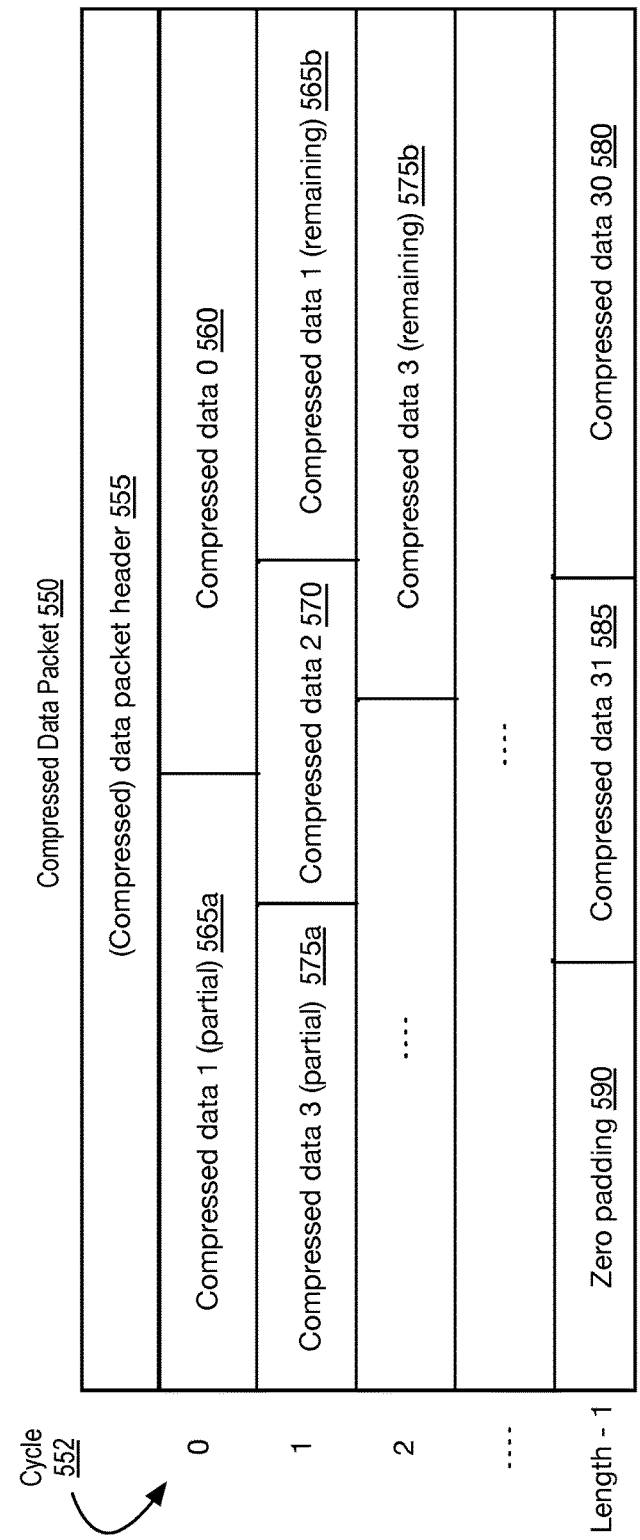
FIG. 5B depicts an example compressed data packet using deep learning numeric data and sparse matrix compression, according to implementations of the disclosure.

FIG. 5B depicts an example compressed data packet 550 based on deep learning numeric data and sparse matrix compression, according to implementations of the disclosure. In one implementation, compressed data packet 550 may be a compressed version of data packet 350 described with respect for FIG. 3B. In one implementation, packet generator 230 of compression engine 200 described with respect to FIG. 2 may generate the compressed data packet 550 using deep learning numeric data and sparse matrix compression, according to implementations of the disclosure.

Compressed data packet 550 may include a compressed data packet header 555 and cycles 552 of compressed cycle data 560-585. In one implementation, each compressed cycle data 560-585 corresponds to a cycle of uncompressed data samples of an uncompressed data packet, such as data packet 350 described with respect to FIG. 3B. In one example, compressed data 0 560 may correspond to compressed data samples of cycle 0 360 of data packet 350. Furthermore, each of compressed data 560-585 may be formatted the same as compressed cycle data 500 described with respect to FIG. 5A. As noted above, each compressed cycle data 560-585 is concatenated into the compressed data packet 550. Any compressed data that extends beyond the allotted bits of a cycle 552 is continued in the next cycle 552 of the compressed data packet 550. For example, compressed data 1 565a, 565b is shown as partially stored in cycle 0 552 (i.e., 565a) and cycle 1 552 (i.e., 565b). Similarly, compressed data 3 575a, 575b is shown as partially stored in cycle 1 552 (i.e., 575a) and cycle 2 552 (i.e., 575b).

After the last compressed data (e.g., compressed data 31 585), the remainder of the compressed data packet is zero padded 590 to the next 512-bit data boundary of the compressed data packet 550. Zero padding refers to fill in 0 values in a determined portion of the data packet. In one implementation, the padding component 240 of the compression engine 200 described with respect to FIG. 2 can perform the zero padding.

In implementations of the disclosure, the compressor dictionary 220 may be implemented as a "running dictionary." The running dictionary version of the compressor dictionary 220 uses matched results from a previous cycle of the data packet for the partial match values in the compressor dictionary 220. For example, in a compressor dictionary that provides for 5 possible partial match options, the first 5 values found in a current 256-bit is stored and used to match the next 256-bit data of the same half (e.g., lower or upper half data samples) in the next cycle of data samples, until the last data of the packet is reached. The compressor dictionary 220 may be initialized with default values for the partial match values based on, for example, data profiling including known ranges of data values or frequent values for a particular workload. These default partial match values used to initialize the compressor dictionary 220 may be stored in registers of the processor, hardware accelerator, and/or other hardware providing the compression engine 200.

Implementations of the disclosure allow software to program the default set of compressor dictionary partial match values "on the fly." For example, if a user knows the range of next data samples, default values from that range can be loaded into the compressor dictionary in real-time (e.g., during execution of the ML/AI/DL workload) to increase the chance of a hit in the cycle of data samples.

Alternatively, the compressor dictionary can maintain the most frequently-used values from the last cycle of data in its prior packet and continue to apply it to the first data of the next packet. That is, implementations of the disclosure can utilize a compressor dictionary from the last cycle of data samples in a current data packet to the first cycle of data samples in the next packet data in the same way as the compressor dictionary is utilized among cycles of data samples within a data packet. As most data crossing packets boundaries belong to one data stream, they range in similar magnitudes and the probability of matches is like that of data matching among cycles of data within a packet. This technique may increase the chance that next data packet's first data samples could be matched or partially matched.

In implementations of the disclosure, when the input data samples are outputs from, for example, activation functions such as (but not limited to) ReLU, sigmoid, and tanh functions, most data sample values are likely to be 0 or 1 values. In one example, packet header bits can be used to represent all 0s and all 1s in 16×32 samples. By eliminating the whole data portion within the packet, compression gains of 100% (from 2 KB+1 header to a header) can be achieved. This improves over the conventional approach's 384-bit compressed data when all data sample values are all 0s (e.g., a compression gain of 81%).

In implementations of the disclosure, when input data is in the form of sparse data matrices where most data sample values are 0s or 1s, there may be a minimal amount of non-0 or non-1 data samples. This can be handled with extending header bits to representing half or quarter sizes of all 0s and 1s. A single-bit header bit represents whole data packet all 0s and all 1s. Using 2 bits in the header, each bit can indicate all 0 and 1 values in half size of packet. Using 3 bits, each bit indicates all 0 and 1 values in quarter size of packet. If all data sample values are all 0s or 1s, that size is compressed with header bits without information stored in data. Otherwise, it is compressed as partially matched. When a quarter size of packets are all 0s or 1s, it is compressed with no data stored. This can cover all sparse matrices.

Figure 6A:
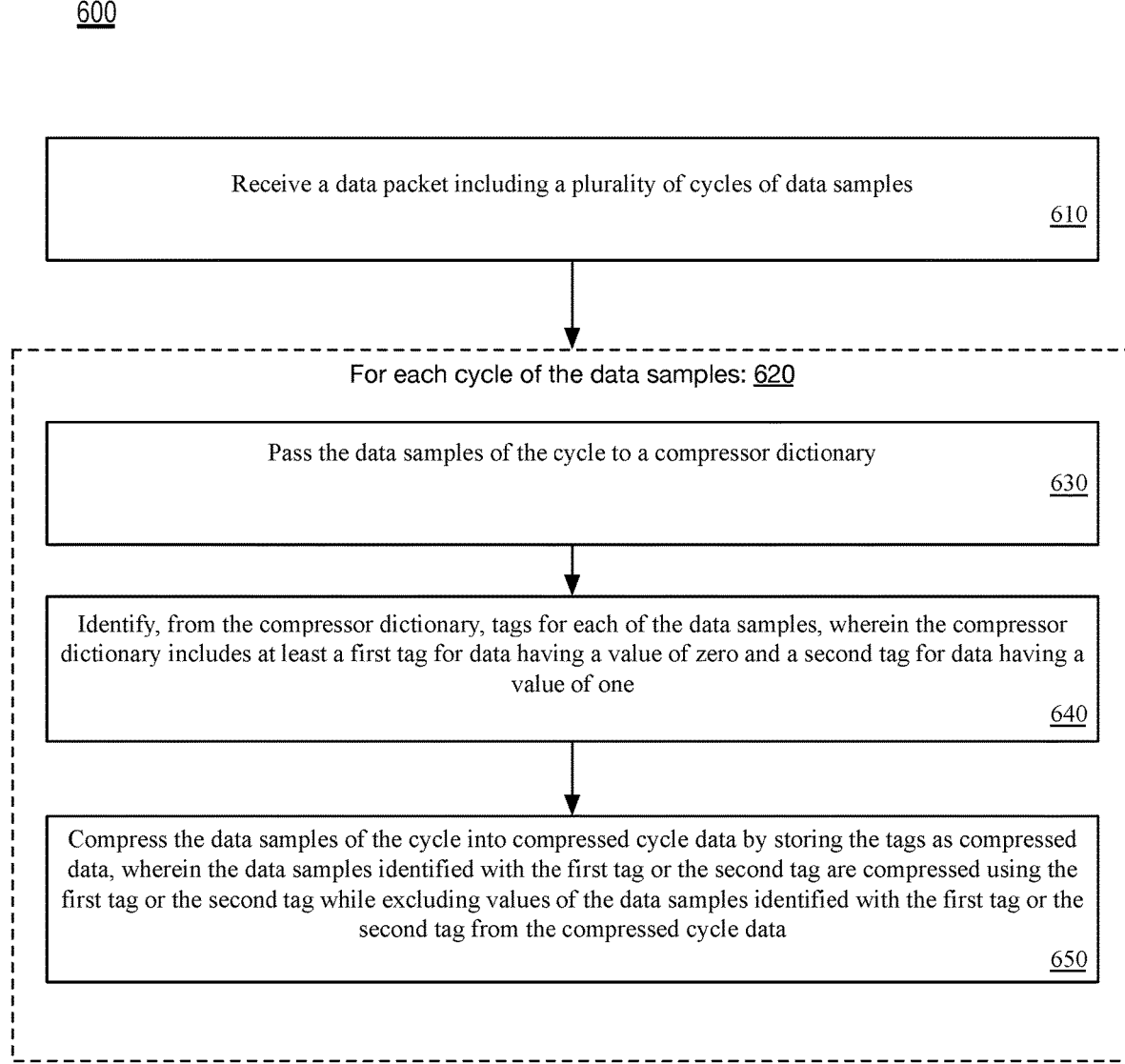
FIG. 6A is a flow diagram illustrating an embodiment of a method for deep learning numeric data and sparse matrix compression.

FIG. 6A is a flow diagram illustrating an embodiment of a method 600 for deep learning numeric data and sparse matrix compression. Method 600 may be performed by processing logic that may comprise hardware (e.g., circuitry, dedicated logic, programmable logic, etc.), software (such as instructions run on a processing device), or a combination thereof. More particularly, the method 600 may be implemented in one or more modules as a set of logic instructions stored in a machine- or computer-readable storage medium such as RAM, ROM, PROM, firmware, flash memory, etc., in configurable logic such as, for example, programmable logic arrays (PLAs), field-programmable gate arrays (FPGAs), complex programmable logic devices (CPLDs), in fixed-functionality logic hardware using circuit technology such as, for example, application-specific integrated circuit (ASIC), complementary metal oxide semiconductor (CMOS) or transistor-transistor logic (TTL) technology, or any combination thereof.

The process of method 600 is illustrated in linear sequences for brevity and clarity in presentation; however, it is contemplated that any number of them can be performed in parallel, asynchronously, or in different orders. Further, for brevity, clarity, and ease of understanding, many of the components and processes described with respect to FIGS. 1-5 may not be repeated or discussed hereafter. In one implementation, a compression engine, such as compression engine 150 of FIG. 1 or compression engine 200 of FIG. 2, may perform method 600.

Method 600 begins at processing block 610 where a data packet is received. In one implementation, the data packet includes a plurality of cycles of data samples. At block 620, blocks 630, 640, and 650 are performed for each cycle of the data samples. At block, data samples of the cycle are passed to a compressor dictionary.

Subsequently, at block 640, tags are identified for each of the data samples using the compressor dictionary. In one implementation, the compressor dictionary includes at least a first tag for data having a value of zero and a second tag for data having a value of one. Lastly, at block 650, the data samples of the cycle are compressed into compressed cycle data. In one implementation, the data samples are compressed by storing the tags as compressed data, where the data samples identified with the first tag or the second tag are compressed using the first tag or the second tag while excluding values of the data samples identified with the first tag or the second tag.

FIG. 6B is a flow diagram illustrating another embodiment of a method 660 for deep learning numeric data and sparse matrix compression. Method 660 may be performed by processing logic that may comprise hardware (e.g., circuitry, dedicated logic, programmable logic, etc.), software (such as instructions run on a processing device), or a combination thereof. More particularly, the method 660 may be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality logic hardware using circuit technology such as, for example, ASIC, CMOS or TTL technology, or any combination thereof.

The process of method 660 is illustrated in linear sequences for brevity and clarity in presentation; however, it is contemplated that any number of them can be performed in parallel, asynchronously, or in different orders. Further, for brevity, clarity, and ease of understanding, many of the components and processes described with respect to FIGS. 1-5 may not be repeated or discussed hereafter. In one implementation, compression engine, such as compression engine 150 of FIG. 1 or compression engine 200 of FIG. 2, may perform method 660.

Method 660 begins at processing block 665 where a processor stores, as a group, tags identified for each data sample of a cycle of a data packet in a compressed cycle data. In one implementation, the tags include at least a first tag indicating the data sample has a zero value or a second tag indicating the data sample has a one value. At block 670, the processor may store, in the compressed cycle data subsequent to the group of the tags, a size byte indicating a size of the compressed cycle data.

At block 675, the processor may store, in the compressed cycle data subsequent to the size byte, partial values of the data samples having partial match tags in the group of the tags. In one implementation, the partial values include sign and exponent values of the data samples identified with the partial match tags. Subsequently, at block 680, the processor may store, in the compressed data sample subsequent to the partial values, a complete portion of the data samples identified with a no match tag in the group of the tags. In one implementation, the complete portion includes exponent and significand values of the data samples identified with the no match tag.

At block 685, the processor may concatenate the compressed cycle data with other compressed cycle data of the data packet in a compressed data packet. Lastly, at block 690, the processor may add zero padding to an end of the compressed data packet subsequent to the compressed data samples.

Figure 7:
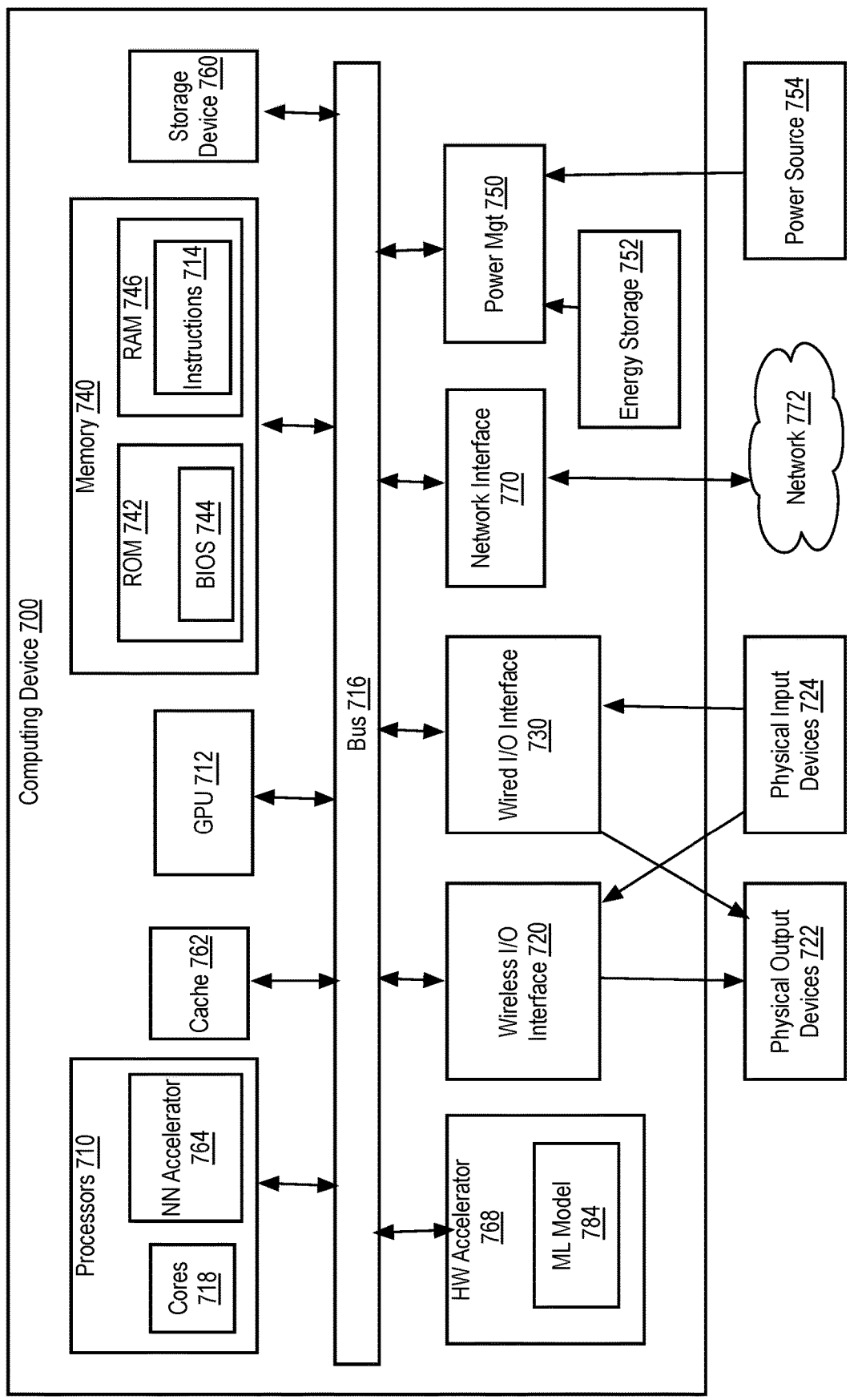
FIG. 7 is a schematic diagram of an illustrative electronic computing device to enable deep learning numeric data and sparse matrix compression, according to some embodiments.

FIG. 7 is a schematic diagram of an illustrative electronic computing device to enable deep learning numeric data and sparse matrix compression, according to some embodiments. In some embodiments, the computing device 700 includes one or more processors 710 including one or more processors cores 718 and a neural network accelerator 764, the neural network accelerator 764 to implement deep learning numeric data and sparse matrix compression, as provided in FIGS. 1-6. In some embodiments, the computing device 700 includes a hardware accelerator 768, the hardware accelerator including a machine learning model 784. In some embodiments, the computing device is to accelerate neural networks implementing the machine learning model 784 with deep learning numeric data and sparse matrix compression, as provided in FIGS. 1-6.

The computing device 700 may additionally include one or more of the following: cache 762, a graphical processing unit (GPU) 712 (which may be the hardware accelerator in some implementations), a wireless input/output (I/O) interface 720, a wired I/O interface 730, system memory 740 (e.g., memory circuitry), power management circuitry 750, non-transitory storage device 760, and a network interface 770 for connection to a network 772. The following discussion provides a brief, general description of the components forming the illustrative computing device 700. Example, non-limiting computing devices 700 may include a desktop computing device, blade server device, workstation, or similar device or system.

In embodiments, the processor cores 718 are capable of executing machine-readable instruction sets 714, reading data and/or instruction sets 714 from one or more storage devices 760 and writing data to the one or more storage devices 760. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. For example, machine-readable instruction sets 714 may include instructions to implement deep learning numeric data and sparse matrix compression, as provided in FIGS. 1-6.

The processor cores 718 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The computing device 700 includes a bus or similar communications link 716 that communicably couples and facilitates the exchange of information and/or data between various system components including the processor cores 718, the cache 762, the graphics processor circuitry 712, one or more wireless I/O interfaces 720, one or more wired I/O interfaces 730, one or more storage devices 760, and/or one or more network interfaces 770. The computing device 700 may be referred to in the singular herein, but this is not intended to limit the embodiments to a single computing device 700, since in some embodiments, there may be more than one computing device 700 that incorporates, includes, or contains any number of communicably coupled, collocated, or remote networked circuits or devices.

The processor cores 718 may include any number, type, or combination of currently available or future developed devices capable of executing machine-readable instruction sets.

The processor cores 718 may include (or be coupled to) but are not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 7 are of conventional design. Consequently, such blocks are not be described in further detail herein, as they will be understood by those skilled in the relevant art. The bus 716 that interconnects at least some of the components of the computing device 700 may employ any currently available or future developed serial or parallel bus structures or architectures.

The system memory 740 may include read-only memory ("ROM") 742 and random access memory ("RAM") 746. A portion of the ROM 742 may be used to store or otherwise retain a basic input/output system ("BIOS") 744. The BIOS 744 provides basic functionality to the computing device 700, for example by causing the processor cores 718 to load and/or execute one or more machine-readable instruction sets 714. In embodiments, at least some of the one or more machine-readable instruction sets 714 cause at least a portion of the processor cores 718 to provide, create, produce, transition, and/or function as a dedicated, specific, and particular machine, for example a word processing machine, a digital image acquisition machine, a media playing machine, a gaming system, a communications device, a smartphone, or similar.

The computing device 700 may include at least one wireless input/output (I/O) interface 720. The at least one wireless I/O interface 720 may be communicably coupled to one or more physical output devices 722 (tactile devices, video displays, audio output devices, hardcopy output devices, etc.). The at least one wireless I/O interface 720 may communicably couple to one or more physical input devices 724 (pointing devices, touchscreens, keyboards, tactile devices, etc.). The at least one wireless I/O interface 720 may include any currently available or future developed wireless I/O interface. Example wireless I/O interfaces include, but are not limited to: BLUETOOTH®, near field communication (NFC), and similar.

The computing device 700 may include one or more wired input/output (I/O) interfaces 730. The at least one wired I/O interface 730 may be communicably coupled to one or more physical output devices 722 (tactile devices, video displays, audio output devices, hardcopy output devices, etc.). The at least one wired I/O interface 730 may be communicably coupled to one or more physical input devices 724 (pointing devices, touchscreens, keyboards, tactile devices, etc.). The wired I/O interface 730 may include any currently available or future developed I/O interface. Example wired I/O interfaces include, but are not limited to: universal serial bus (USB), IEEE 1394 ("FireWire"), and similar.

The computing device 700 may include one or more communicably coupled, non-transitory, data storage devices 760. The data storage devices 760 may include one or more hard disk drives (HDDs) and/or one or more solid-state storage devices (SSDs). The one or more data storage devices 760 may include any current or future developed storage appliances, network storage devices, and/or systems. Non-limiting examples of such data storage devices 760 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 760 may include one or more removable storage devices, such as one or more flash drives, flash memories, flash storage units, or similar appliances or devices capable of communicable coupling to and decoupling from the computing device 700.

The one or more data storage devices 760 may include interfaces or controllers (not shown) communicatively coupling the respective storage device or system to the bus 716. The one or more data storage devices 760 may store, retain, or otherwise contain machine-readable instruction sets, data structures, program modules, data stores, databases, logical structures, and/or other data useful to the processor cores 718 and/or graphics processor circuitry 712 and/or one or more applications executed on or by the processor cores 718 and/or graphics processor circuitry 712. In some instances, one or more data storage devices 760 may be communicably coupled to the processor cores 718, for example via the bus 716 or via one or more wired communications interfaces 730 (e.g., Universal Serial Bus or USB); one or more wireless communications interfaces 720 (e.g., Bluetooth®, Near Field Communication or NFC); and/or one or more network interfaces 770 (IEEE 802.3 or Ethernet, IEEE 802.11, or Wi-Fi®, etc.).

Processor-readable instruction sets 714 and other programs, applications, logic sets, and/or modules may be stored in whole or in part in the system memory 740. Such instruction sets 714 may be transferred, in whole or in part, from the one or more data storage devices 760. The instruction sets 714 may be loaded, stored, or otherwise retained in system memory 740, in whole or in part, during execution by the processor cores 718 and/or graphics processor circuitry 712.

The computing device 700 may include power management circuitry 750 that controls one or more operational aspects of the energy storage device 752. In embodiments, the energy storage device 752 may include one or more primary (i.e., non-rechargeable) or secondary (i.e., rechargeable) batteries or similar energy storage devices. In embodiments, the energy storage device 752 may include one or more supercapacitors or ultracapacitors. In embodiments, the power management circuitry 750 may alter, adjust, or control the flow of energy from an external power source 754 to the energy storage device 752 and/or to the computing device 700. The power source 754 may include, but is not limited to, a solar power system, a commercial electric grid, a portable generator, an external energy storage device, or any combination thereof.

For convenience, the processor cores 718, the graphics processor circuitry 712, the wireless I/O interface 720, the wired I/O interface 730, the storage device 760, and the network interface 770 are illustrated as communicatively coupled to each other via the bus 716, thereby providing connectivity between the above-described components. In alternative embodiments, the above-described components may be communicatively coupled in a different manner than illustrated in FIG. 7. For example, one or more of the above-described components may be directly coupled to other components, or may be coupled to each other, via one or more intermediary components (not shown). In another example, one or more of the above-described components may be integrated into the processor cores 718 and/or the graphics processor circuitry 712. In some embodiments, all or a portion of the bus 716 may be omitted and the components are coupled directly to each other using suitable wired or wireless connections.

Flowcharts representative of example hardware logic, machine readable instructions, hardware implemented state machines, and/or any combination thereof for implementing the computing system 100 (FIG. 1), the compression engine 200 (FIG. 2), the method 600 (FIG. 6A), and the method 660 (FIG. 6B), already discussed. The machine readable instructions may be one or more executable programs or portion(s) of an executable program for execution by a computer processor, such as the processor 710 shown in the example computing device 700 discussed above in connection with FIG. 7. The program may be embodied in software stored on a non-transitory computer readable storage medium such as a CD-ROM, a floppy disk, a hard drive, a DVD, a Blu-ray disk, or a memory associated with the processor 710, but the whole program and/or parts thereof could alternatively be executed by a device other than the processor 710 and/or embodied in firmware or dedicated hardware. Further, although the example program is described with reference to the flowcharts illustrated in FIGS. 6A and/or 6B, many other methods of implementing the example computing system 100 may alternatively be used. For example, the order of execution of the blocks may be changed, and/or some of the blocks described may be changed, eliminated, or combined. Additionally, or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may utilize one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but utilize addition of a library (e.g., a dynamic link library (DLL)), a software development kit (SDK), an application programming interface (API), etc. in order to execute the instructions on a particular computing device or other device. In another example, the machine readable instructions may be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 5 and/or 6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended.

The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

The following examples pertain to further embodiments. Example 1 is an apparatus to facilitate deep learning numeric data and sparse matrix compression. The apparatus of Example 1 comprises a processor including a compression engine to: receive a data packet comprising a plurality of cycles of data samples; and for each cycle of the data samples: pass the data samples of the cycle to a compressor dictionary; identify, from the compressor dictionary, tags for each of the data samples, wherein the compressor dictionary comprises at least a first tag for data having a value of zero and a second tag for data having a value of one; and compress the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

In Example 2, the subject matter of Example 1 can optionally include wherein the compressor dictionary comprises a look up table or a hash table. In Example 3, the subject matter of any one of Examples 1-2 can optionally include wherein the tags further comprise at least a third tag indicating no match in the compressor dictionary, and a plurality of additional tags indicating a partial match of the data sample to at least one value in the compressor dictionary.

In Example 4, the subject matter of any one of Examples 1-3 can optionally include wherein the compression engine to compress the data samples further comprises: storing, subsequent to the tags in the compressed cycle data, partial values of the data samples identified with any of the plurality of additional tags, the partial values comprising sign and exponent values of the data samples having any of the plurality of additional tags; and storing, subsequent to storing the partial values, a whole portion of the data samples identified with the third tag.

In Example 5, the subject matter of any one of Examples 1-4 can optionally include wherein the compressed cycle data of each cycle of the data packet is concatenated in a compressed data packet, and wherein a remainder of the compressed data packet subsequent to a last compressed cycle data is zero padded. In Example 6, the subject matter of any one of Examples 1-5 can optionally include wherein compressing the data samples further comprises adding a size byte to the compressed cycle data, wherein the size byte to indicate a size of the compressed cycle data. In Example 7, the subject matter of any one of Examples 1-6 can optionally include wherein the size byte is stored in the compressed cycle data subsequent to the tags and prior to the partial values.

In Example 8, the subject matter of any one of Examples 1-7 can optionally include wherein the plurality of additional tags are updated after compressing each cycle of the data packet using data values of the data samples from a previous compressed cycle of the data packet. In Example 9, the subject matter of any one of Examples 1-8 can optionally include wherein for each cycle of data samples: divide the data samples into upper half data samples and lower half data samples; pass the upper half data samples to a first sub-dictionary of the compressor dictionary and the lower half data samples to a second sub-dictionary of the compressor dictionary, wherein the first sub-dictionary and the second sub-dictionary comprise identical entries; identify the tags for each of the upper half data samples using the first sub-dictionary; and identify the tags for each of the lower half data samples using the second sub-dictionary; wherein the identifying the tags for each of the upper half data samples and each of the lower half data sample is performed in parallel.

In Example 10, the subject matter of any one of Examples 1-9 can optionally include wherein the tags comprise a 3-bit value, wherein the compressor dictionary stores 16 entries, and wherein the first sub-dictionary comprises 8 entries of the compressor dictionary and the second sub-dictionary comprises another 8 entries of the compressor dictionary. In Example 11, the subject matter of any one of Examples 1-10 can optionally include wherein compression engine is applied to output of at least one of activation functions or weight values of a machine learning workload or a deep learning workload.

Example 12 is at least one non-transitory machine readable storage medium for facilitating deep learning numeric data and sparse matrix compression. The non-transitory computer-readable storage medium of Example 12 having stored thereon executable computer program instructions that, when executed by one or more processors, cause the one or more processors to perform operations comprising: receive, by the at least one processor, a data packet comprising a plurality of cycles of data samples; and for each cycle of the data samples: pass the data samples of the cycle to a compressor dictionary; identify, from the compressor dictionary, tags for each of the data samples, wherein the compressor dictionary comprises at least a first tag for data having a value of zero and a second tag for data having a value of one; and compress the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

In Example 13, the subject matter of Example 12 can optionally include wherein the tags further comprise at least a third tag indicating no match in the compressor dictionary, and a plurality of additional tags indicating a partial match of the data sample to a value in the compressor dictionary. In Example 14, the subject matter of Examples 12-13 can optionally include wherein the at least one processor to compress the data samples further comprises the at least one processor to: store, subsequent to the tags in the compressed cycle data, partial values of the data samples identified with any of the plurality of additional tags, the partial values comprising sign and exponent values of the data samples having any of the plurality of additional tags; and store, subsequent to storing the partial values, a whole portion of the data samples identified with the third tag.

In Example 15, the subject matter of Examples 12-14 can optionally include wherein the compressed cycle data of each cycle of the data packet is concatenated in a compressed data packet, and wherein a remainder of the compressed data packet subsequent to a last compressed cycle data is zero padded. In Example 16, the subject matter of Examples 12-15 can optionally include wherein the at least one processor to compress the data samples further comprises the at least one processor to add a size byte to the compressed cycle data, wherein the size byte to indicate a size of the compressed cycle data.

Example 17 is a method for facilitating deep learning numeric data and sparse matrix compression. The method of Example 17 can include receiving, by at least one processor, a data packet comprising a plurality of cycles of data samples; and for each cycle of the data samples: passing the data samples of the cycle to a compressor dictionary; identifying, from the compressor dictionary, tags for each of the data samples, wherein the compressor dictionary comprises at least a first tag for data having a value of zero and a second tag for data having a value of one; and compressing the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

In Example 18, the subject matter of Example 17 can optionally include wherein the tags further comprise at least a third tag indicating no match in the compressor dictionary, and a plurality of additional tags indicating a partial match of the data sample to a value in the compressor dictionary. In Example 19, the subject matter of any one of Examples 17-18 can optionally include wherein compressing the data samples further comprises: storing, subsequent to the tags in the compressed cycle data, partial values of the data samples identified with any of the plurality of additional tags, the partial values comprising sign and exponent values of the data samples having any of the plurality of additional tags; storing, subsequent to storing the partial values, a whole portion of the data samples identified with the third tag; and adding a size byte to the compressed cycle data, wherein the size byte to indicate a size of the compressed cycle data.

In Example 20, the subject matter of any one of Examples 17-19 can optionally include wherein the compressed cycle data of each cycle of the data packet is concatenated in a compressed data packet, and wherein a remainder of the compressed data packet subsequent to a last compressed cycle data is zero padded.

Example 21 is a system for facilitating deep learning numeric data and sparse matrix compression. The system of Example 21 can optionally include a memory, and a processor communicably coupled to the memory. The processor of the system of Example 21 can comprise a compression engine to: receive a data packet comprising a plurality of cycles of data samples; and for each cycle of the data samples: pass the data samples of the cycle to a compressor dictionary; identify, from the compressor dictionary, tags for each of the data samples, wherein the compressor dictionary comprises at least a first tag for data having a value of zero and a second tag for data having a value of one; and compress the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

In Example 22, the subject matter of Example 12 can optionally include wherein the compressor dictionary comprises a look up table or a hash table. In Example 23, the subject matter of any one of Examples 21-22 can optionally include wherein the tags further comprise at least a third tag indicating no match in the compressor dictionary, and a plurality of additional tags indicating a partial match of the data sample to at least one value in the compressor dictionary.

In Example 24, the subject matter of any one of Examples 21-23 can optionally include wherein the compression engine to compress the data samples further comprises: storing, subsequent to the tags in the compressed cycle data, partial values of the data samples identified with any of the plurality of additional tags, the partial values comprising sign and exponent values of the data samples having any of the plurality of additional tags; and storing, subsequent to storing the partial values, a whole portion of the data samples identified with the third tag.

In Example 25, the subject matter of any one of Examples 21-24 can optionally include wherein the compressed cycle data of each cycle of the data packet is concatenated in a compressed data packet, and wherein a remainder of the compressed data packet subsequent to a last compressed cycle data is zero padded. In Example 26, the subject matter of any one of Examples 21-25 can optionally include wherein compressing the data samples further comprises adding a size byte to the compressed cycle data, wherein the size byte to indicate a size of the compressed cycle data. In Example 27, the subject matter of any one of Examples 21-26 can optionally include wherein the size byte is stored in the compressed cycle data subsequent to the tags and prior to the partial values.

In Example 28, the subject matter of any one of Examples 21-27 can optionally include wherein the plurality of additional tags are updated after compressing each cycle of the data packet using data values of the data samples from a previous compressed cycle of the data packet. In Example 29, the subject matter of any one of Examples 21-28 can optionally include wherein for each cycle of data samples: divide the data samples into upper half data samples and lower half data samples; pass the upper half data samples to a first sub-dictionary of the compressor dictionary and the lower half data samples to a second sub-dictionary of the compressor dictionary, wherein the first sub-dictionary and the second sub-dictionary comprise identical entries; identify the tags for each of the upper half data samples using the first sub-dictionary; and identify the tags for each of the lower half data samples using the second sub-dictionary; wherein the identifying the tags for each of the upper half data samples and each of the lower half data sample is performed in parallel.

In Example 30, the subject matter of any one of Examples 21-29 can optionally include wherein the tags comprise a 3-bit value, wherein the compressor dictionary stores 16 entries, and wherein the first sub-dictionary comprises 8 entries of the compressor dictionary and the second sub-dictionary comprises another 8 entries of the compressor dictionary. In Example 31, the subject matter of any one of Examples 21-30 can optionally include wherein compression engine is applied to output of at least one of activation functions or weight values of a machine learning workload or a deep learning workload.

Example 32 is an apparatus for facilitating deep learning numeric data and sparse matrix compression according to implementations of the disclosure. The apparatus of Example 32 can comprise means for receiving a data packet comprising a plurality of cycles of data samples; and for each cycle of the data samples: means for passing the data samples of the cycle to a compressor dictionary; means for identifying, from the compressor dictionary, tags for each of the data samples, wherein the compressor dictionary comprises at least a first tag for data having a value of zero and a second tag for data having a value of one; and means for compressing the data samples into compressed cycle data by storing the tags as compressed data, wherein the data samples identified with the first tag are compressed using the first tag and the data samples identified with the second tag are compressed using the second tag at the same time as values of the data samples identified with the first tag or the second tag are excluded from the compressed cycle data.

In Example 33, the subject matter of Example 32 can optionally include the apparatus further configured to perform the method of any one of the Examples 18 to 20.

Example 34 is at least one machine readable medium comprising a plurality of instructions that in response to being executed on a computing device, cause the computing device to carry out a method according to any one of Examples 17-20.

Example 35 is an apparatus for facilitating deep learning numeric data and sparse matrix compression, configured to perform the method of any one of Examples 17-20. Example 36 is an apparatus for facilitating deep learning numeric data and sparse matrix compression comprising means for performing the method of any one of claims 17 to 20. Specifics in the Examples may be used anywhere in one or more embodiments.

The foregoing description and drawings are to be regarded in an illustrative rather than a restrictive sense. Persons skilled in the art will understand that various modifications and changes may be made to the embodiments described herein without departing from the broader spirit and scope of the features set forth in the appended claims.

What is claimed is:

1. An apparatus comprising:
   a processor to:
   receive a data packet comprising a plurality of cycles of data samples; and
   for one or more cycles of the data samples:
   pass the data samples of the one or more cycles to a compressor dictionary;
   identify, from the compressor dictionary, tags for each of the data samples,
   wherein the compressor dictionary comprises at least a first tag for data having a value of zero and a second tag for data having a value of one; and
   compress the data samples into compressed cycle data by storing the tags as compressed data, wherein the data samples identified with the first tag are represented in the compressed data using the first tag and the data samples identified with the second tag are represented in the compressed data using the second tag, and wherein values of the data samples identified with the first tag or the second tag are excluded from the compressed cycle data.

2. The apparatus of claim 1, wherein the compressor dictionary comprises a look up table or a hash table.

3. The apparatus of claim 1, wherein the tags further comprise at least a third tag indicating no match in the compressor dictionary, and a plurality of additional tags indicating a partial match of a data sample of the data samples to at least one value in the compressor dictionary.

4. The apparatus of claim 3, wherein processor to compress the data samples further comprises:
   storing, subsequent to the tags in the compressed cycle data, partial values of the data samples identified with any of the plurality of additional tags, the partial values comprising sign and exponent values of the data samples having any of the plurality of additional tags; and
   storing, subsequent to storing the partial values, a whole portion of the data samples identified with the third tag.

5. The apparatus of claim 4, wherein the compressed cycle data of the plurality of cycles of the data packet is concatenated in a compressed data packet, and wherein a remainder of the compressed data packet subsequent to a last compressed cycle data is zero padded.

6. The apparatus of claim 5, wherein compressing the data samples further comprises adding a size byte to the compressed cycle data, wherein the size byte to indicate a size of the compressed cycle data.

7. The apparatus of claim 6, wherein the size byte is stored in the compressed cycle data subsequent to the tags and prior to the partial values.

8. The apparatus of claim 3, wherein the plurality of additional tags are updated after compressing the plurality of cycles of the data packet using data values of the data samples from a previous compressed cycle of the data packet.

9. The apparatus of claim 1, wherein for the one or more cycles of the data samples:
   divide the data samples into upper half data samples and lower half data samples;
   pass the upper half data samples to a first sub-dictionary of the compressor dictionary and the lower half data samples to a second sub-dictionary of the compressor dictionary, wherein the first sub-dictionary and the second sub-dictionary comprise identical entries;
   identify the tags for each of the upper half data samples using the first sub-dictionary; and
   identify the tags for each of the lower half data samples using the second sub-dictionary;
   wherein the identifying the tags for each of the upper half data samples and each of the lower half data samples is performed in parallel.

10. The apparatus of claim 9, wherein the tags comprise a 3-bit value, wherein the compressor dictionary stores 16 entries, and wherein the first sub-dictionary comprises 8 entries of the compressor dictionary and the second subdictionary comprises another 8 entries of the compressor dictionary.

11. The apparatus of claim 1, wherein the processor is further to utilize compression circuitry to process output of at least one of activation functions or weight values of a machine learning workload or a deep learning workload.

12. At least one non-transitory machine readable storage medium comprising instructions that, when executed, cause at least one processor to at least:
receive, by the at least one processor, a data packet comprising a plurality of cycles of data samples; and
for one or more cycles of the data samples:
pass the data samples of the one or more cycles to a compressor dictionary;
identify, from the compressor dictionary, tags for each of the data samples, wherein the compressor dictionary comprises at least a first tag for data having a value of zero and a second tag for data having a value of one; and
compress the data samples into compressed cycle data by storing the tags as compressed data, wherein the data samples identified with the first tag are represented in the compressed data using the first tag and the data samples identified with the second tag are represented in the compressed data using the second tag, and wherein values of the data samples identified with the first tag or the second tag are excluded from the compressed cycle data.

13. The at least one non-transitory machine readable storage medium of claim 12, wherein the tags further comprise at least a third tag indicating no match in the compressor dictionary, and a plurality of additional tags indicating a partial match of a data sample of the data samples to a value in the compressor dictionary.

14. The at least one non-transitory machine readable storage medium of claim 13, wherein the at least one processor to compress the data samples further comprises the at least one processor to:
store, subsequent to the tags in the compressed cycle data, partial values of the data samples identified with any of the plurality of additional tags, the partial values comprising sign and exponent values of the data samples having any of the plurality of additional tags; and
store, subsequent to storing the partial values, a whole portion of the data samples identified with the third tag.

15. The at least one non-transitory machine readable storage medium of claim 14, wherein the compressed cycle data of the plurality of cycles of the data packet is concatenated in a compressed data packet, and wherein a remainder of the compressed data packet subsequent to a last compressed cycle data is zero padded.

16. The at least one non-transitory machine readable storage medium of claim 15, wherein the at least one processor to compress the data samples further comprises the at least one processor to add a size byte to the compressed cycle data, wherein the size byte to indicate a size of the compressed cycle data.

17. A method comprising:
receiving, by at least one processor, a data packet comprising a plurality of cycles of data samples; and
for one or more cycles of the data samples:
passing the data samples of the one or more cycles to a compressor dictionary;
identifying, from the compressor dictionary, tags for each of the data samples, wherein the compressor dictionary comprises at least a first tag for data having a value of zero and a second tag for data having a value of one; and
compressing the data samples into compressed cycle data by storing the tags as compressed data, wherein the data samples identified with the first tag are represented in the compressed data using the first tag and the data samples identified with the second tag are represented in the compressed data using the second tag, and wherein values of the data samples identified with the first tag or the second tag are excluded from the compressed cycle data.

18. The method of claim 17, wherein the tags further comprise at least a third tag indicating no match in the compressor dictionary, and a plurality of additional tags indicating a partial match of a data sample of the data samples to a value in the compressor dictionary.

19. The method of claim 18, wherein compressing the data samples further comprises:
storing, subsequent to the tags in the compressed cycle data, partial values of the data samples identified with any of the plurality of additional tags, the partial values comprising sign and exponent values of the data samples having any of the plurality of additional tags;
storing, subsequent to storing the partial values, a whole portion of the data samples identified with the third tag; and
adding a size byte to the compressed cycle data, wherein the size byte to indicate a size of the compressed cycle data.

20. The method of claim 19, wherein the compressed cycle data of the plurality of cycles of the data packet is concatenated in a compressed data packet, and wherein a remainder of the compressed data packet subsequent to a last compressed cycle data is zero padded.

* * * * *